United States Patent [19]

Hwu

[11] Patent Number: 6,159,798
[45] Date of Patent: Dec. 12, 2000

[54] METHOD FOR FORMING A FLOATING GATE WITH IMPROVED SURFACE ROUGHNESS

[75] Inventor: Jyng-Ping Hwu, Hsinchu, Taiwan

[73] Assignee: Winbond Electronics Corporation, Hsinchu, Taiwan

[21] Appl. No.: 09/193,117

[22] Filed: Nov. 17, 1998

[51] Int. Cl.$^7$ ................................................ H01L 21/336
[52] U.S. Cl. ............................................ 438/257; 438/593
[58] Field of Search ...................................... 438/593, 157, 438/257, 260, 287; 257/365, 288

[56] References Cited

U.S. PATENT DOCUMENTS

| | | |
|---|---|---|
| 4,613,956 | 9/1986 | Paterson et al. . |
| 5,704,987 | 1/1998 | Huynh et al. . |
| 5,780,891 | 7/1998 | Kauffman et al. . |

OTHER PUBLICATIONS

S. Ghandhi, VLSI Fabrication Principles: Silicon and Gallium Arsenide, 1983, John Wiley & Sons, p. 522.

Primary Examiner—Charles Bowers
Assistant Examiner—Evan Pert
Attorney, Agent, or Firm—Finnegan, Henderson, Farabow, Garrett & Dunner, L.L.P.

[57] ABSTRACT

A method for forming a floating gate of a non-volatile memory device includes steps of defining a substrate, forming a plurality of field isolation structures within the substrate, planarizing the substrate that includes the plurality of field isolation structures, and growing a first dielectric layer on the substrate. The method also includes steps of depositing a polysilicon layer over the first dielectric layer, chemical mechanical polishing the polysilicon layer with an oxide etchant to achieve local planarization, growing a second dielectric layer over the planarized polysilicon layer, depositing a third dielectric layer over the second dielectric layer, forming a fourth dielectric layer over the third dielectric layer, and patterning and forming a floating gate in the polysilicon layer.

17 Claims, 2 Drawing Sheets

METHOD FOR FORMING A FLOATING GATE WITH IMPROVED SURFACE ROUGHNESS

BACKGROUND OF THE INVENTION

1. Field of the Invention

This invention pertains in general to a non-volatile memory device and, more particularly, to a method of forming a gate oxide on a polysilicon floating gate with improved surface roughness through chemical metal polishing.

2. Description of the Related Art

In a non-volatile memory device, the integrity of the dielectric layer that separates a floating gate from a control gate mainly determines the leakage and breakdown characteristics of the memory device. The dielectric layer, commonly known as a gate oxide, is formed by oxidation where a layer of silicon dioxide $SiO_2$ is grown on a polysilicon layer in an oxygen-rich environment at an elevated temperature. During the oxidation process, the integrity of the gate oxide is partly determined by the roughness of the surface on which the gate oxide is grown. Other factors such as oxidation conditions also influence the integrity of the gate oxide.

A rough polysilicon surface is undesirable because such surface roughness leads to high local electric fields that disrupt device operations and obstructs the formation of a strong gate oxide layer during the oxidation process. The effect of a polysilicon layer having a rough surface becomes more evident in memory devices scaled down to sub-micron applications.

SUMMARY OF THE INVENTION

Accordingly, the present invention is directed to a method of forming a gate oxide on a floating polysilicon gate with improved surface roughness that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims hereof, as well as the appended drawings.

To achieve these and other advantages, and in accordance with the purpose of the invention as embodied and broadly described, there is provided a method for forming a floating gate of a non-volatile memory device that has a substantially planar substrate and a first layer of dielectric material disposed over the substrate. The method comprises the steps of depositing a polysilicon layer over the first layer of dielectric material, chemical mechanical polishing the polysilicon layer with an oxide etchant to achieve planarization, forming a second dielectric layer over the planarized polysilicon layer, and patterning and forming a floating gate in the polysilicon layer.

In another aspect, the polishing step includes a step of diluting the oxide etchant to a predetermined ratio.

In yet another aspect, the method includes the steps of forming a third dielectric layer over the second dielectric layer wherein the second dielectric layer and the third dielectric layer are composed of different dielectric materials, and forming a fourth dielectric layer over the third dielectric layer wherein the third dielectric layer and the fourth dielectric layer are composed of different dielectric materials.

In still another aspect, the method includes a step of annealing the planarized polysilicon layer preceding the step of forming a second dielectric layer.

Also in accordance with the invention, there is provided a method for forming a floating gate of a non-volatile memory device that includes the steps of defining a substrate, forming a plurality of field isolation structures within the substrate, forming a first dielectric layer on the substrate, depositing a polysilicon layer over the first dielectric layer, and chemical mechanical polishing the polysilicon layer with an oxide etchant to achieve planarization. The method also includes the steps of forming a second dielectric layer over the planarized polysilicon layer, forming a third dielectric layer over the second dielectric layer wherein the second dielectric layer and the third dielectric layer are composed of different dielectric materials, forming a fourth dielectric layer over the third dielectric layer wherein the third dielectric layer and the fourth dielectric layer are composed of different materials, and patterning and forming a floating gate in the polysilicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
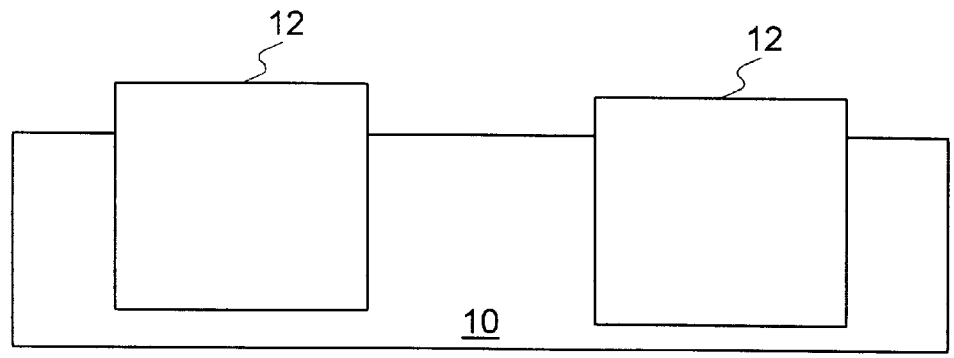
FIGS. 1 through 4 are cross-sectional views of the formation of the gate oxide on a polysilicon floating gate with improved surface roughness in accordance with the method of the present invention.

A method in accordance with the present invention is explained with reference to FIGS. 1 to 4. Referring to FIG. 1, a process of the present invention begins by defining a wafer substrate 10. Substrate 10 includes a plurality of field isolation structures 12. Field isolation structures 12 may be formed with any known field-isolating techniques, including recessed and semi-recessed field oxides and shallow trench isolations. A preferred embodiment of the present method requires that the substrate surface be substantially planar before a pad oxide is formed over substrate 10. Therefore, any known planarization step appropriate for a specific field-isolating technique used to form field isolation structures 12 is performed over the entire wafer substrate 10. The step of global planarization results in a substantially planar surface.

Figure 2:
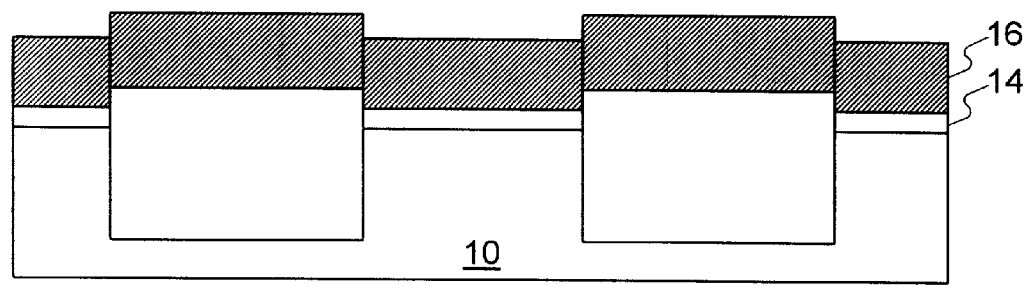

Referring to FIG. 2, an oxide layer 14 is grown over substrate 10 and field isolation structures 12. Oxide layer 14 is also known as a tunneling oxide or pad oxide and is composed of silicon dioxide. A layer of polysilicon 16 is then deposited over oxide layer 14. A conventional chemical vapor deposition ("CVD") technique may be used to deposit polysilicon layer 16, which eventually would be patterned to form a plurality of floating gates. After the step of depositing polysilicon layer 16, a step of doping is performed to render layer 16 conductive.

The method of the present invention continues with a step of planarizing polysilicon layer 16 with chemical mechanical polishing ("CMP"). It is known in the art of semiconductor manufacturing that CMP is a "dirty" process because of polishing-slurry particles used in the process. In addition, CMP is used only at the front end or the back end of the manufacturing process. Conventionally, a polysilicon etchant, or polysilicon slurry, is used in a CMP process on polysilicon and an oxide etchant is used on oxides. Silicon etchants include anisotropic etchants such as sodium hydroxide, potassium hydroxide, and ethylenediamine, and isotropic etchants such as a combination of nitric, hydrofluoric acid and acetic. Etch rates for polysilicon etchants are generally very fast as compared to oxide etchants. A typical mixture of a silicon dioxide etchant includes hydrofluoric acid (HF) and water, together with a buffering agent ammonium fluoride ($NH_4F$), and provides a slower etch rate.

In a preferred embodiment of the present invention, a diluted oxide etchant is used to etch polysilicon layer 16. The oxide etchant may be diluted to one-twentieth of its original concentration and therefore provides an even slower etch rate than the undiluted etchant. A CMP process with a slower etch rate produces improved local planarization and uniformity of polysilicon layer 16. However, the CMP process, as does the doping process, destroys the surface crystalline structure of polysilicon layer 16 and therefore a step of repairing the crystalline structure of layer 16 should be employed.

Figure 3:
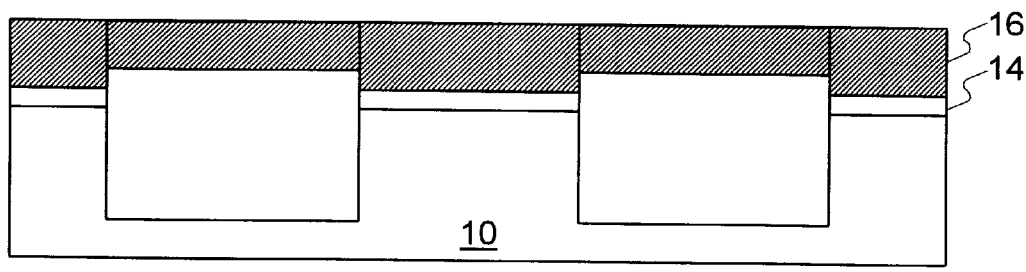
Figure 4:
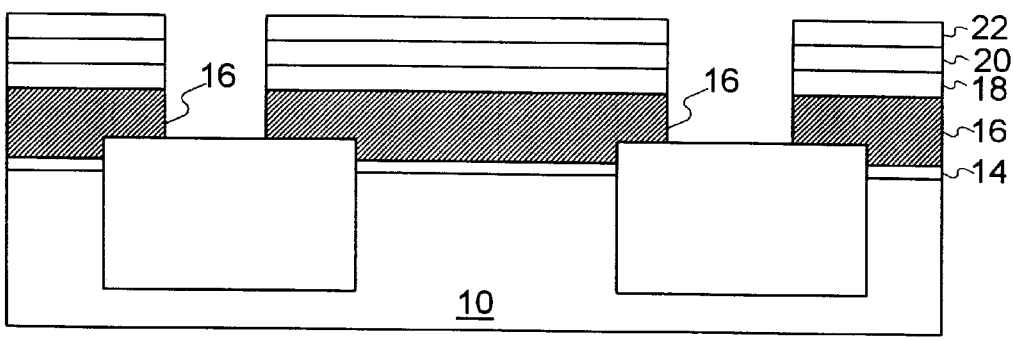

FIG. 3 shows a substantially planar polysilicon layer 16. Referring to FIG. 3, the method according to the present invention continues by annealing the polysilicon-oxide-substrate structure to recrystallize polysilicon layer 16 thereby repairing the crystalline structure. FIG. 4 shows the steps to form dielectric layers that separate polysilicon layer 16 from another polysilicon layer (not shown) that would be patterned to form a plurality of control gates that overlap the floating gates.

Referring to FIG. 4, a gate oxide layer 18 is formed over planarized polysilicon layer 16. Gate oxide layer 18 is formed through oxidation and is composed of silicon dioxide. Because polysilicon layer 16 is substantially planar, gate oxide layer 18 may be grown with high integrity and uniformity. Another layer of dielectric material 20 is disposed over gate oxide layer 18. Dielectric material 20 may be deposited through a known process such as CVD and may be composed is silicon nitride. Disposed over silicon nitride layer 20 is another dielectric layer 22. Layer 22 may be grown or deposited over silicon nitride layer 20 and is composed of silicon dioxide. The oxide-nitride-oxide-polysilicon structure is then patterned to form a plurality of floating gates 16 and an oxide-nitride-oxide structure disposed over each of floating gates 16. Conventional steps of forming a non-volatile memory device may then be performed to complete the manufacturing process of a non-volatile memory device.

It will also be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a floating gate of a non-volatile memory device having a substantially planar substrate and a first layer of dielectric material disposed over the substrate, comprising the steps of:

depositing a polysilicon layer over the first layer of dielectric material;

chemical mechanical polishing said polysilicon layer with an oxide etchant to achieve planarization;

forming a second dielectric layer over said planarized polysilicon layer; and patterning and forming a floating gate in said polysilicon layer.

2. The method as claimed in claim 1 wherein said polishing step includes a step of diluting said oxide etchant to a predetermined ratio.

3. The method as claimed in claim 1 further including the steps of forming a third dielectric layer over said second dielectric layer wherein said second dielectric layer and said third dielectric layer are composed of different dielectric materials; and forming a fourth dielectric layer over said third dielectric layer wherein said third dielectric layer and said fourth dielectric layer are composed of different dielectric materials.

4. The method as claimed in claim 3 wherein said step of forming a fourth dielectric layer includes a step of oxidation.

5. The method as claimed in claim 3 wherein said step of forming a third dielectric layer includes a step of forming a silicon nitride layer.

6. The method as claimed in claim 3 wherein said step of forming a fourth dielectric layer includes a step of forming a silicon dioxide layer.

7. The method as claimed in claim 1 wherein said step of forming a second dielectric layer includes a step of forming a silicon dioxide layer.

8. The method as claimed in claim 1 further including a step of annealing said planarized polysilicon layer preceding said step of forming a second dielectric layer.

9. The method as claimed in claim 1 further including a step of doping said polysilicon layer after said step of depositing said polysilicon layer.

10. A method for forming a floating gate of a non-volatile memory device, comprising the steps of:

defining a substrate;

forming a plurality of field isolation structures within said substrate;

forming a first dielectric layer on said substrate;

depositing a polysilicon layer over said first dielectric layer;

chemical mechanical polishing said polysilicon layer with an oxide etchant to achieve planarization;

forming a second dielectric layer over said planarized polysilicon layer;

forming a third dielectric layer over said second dielectric layer wherein said second dielectric layer and said third dielectric layer are composed of different dielectric materials;

forming a fourth dielectric layer over said third dielectric layer wherein said third dielectric layer and said fourth dielectric layer are composed of different materials; and patterning and forming a floating gate in said polysilicon layer.

11. The method as claimed in claim 10 wherein said polishing step includes a step of diluting said oxide etchant to a predetermined ratio.

12. The method as claimed in claim 10 wherein said step of forming a fourth dielectric layer includes a step of oxidation.

13. The method as claimed in claim 10 wherein said step of forming a second dielectric layer includes a step of forming a silicon dioxide layer.

14. The method as claimed in claim 10 wherein said step of forming a third dielectric layer includes a step of forming a silicon nitride layer.

15. The method as claimed in claim 10 wherein said step of forming a fourth dielectric layer includes a step of forming a silicon dioxide layer.

16. The method as claimed in claim 10 further including a step of annealing said planarized polysilicon layer preceding said step of forming a second dielectric layer.

17. The method as claimed in claim 10 further including a step of doping said polysilicon layer after said step of depositing said polysilicon layer.

* * * * *